(12) United States Patent  
Ryoki et al.

(10) Patent No.: US 9,305,946 B2
(45) Date of Patent: Apr. 5, 2016

(54) PHOTOELECTRIC CONVERSION APPARATUS THAT MAINTAINS IMAGE QUALITY AND IMAGE PICKUP SYSTEM

(71) Applicant: CANON KABUSHIKI KAISHA, Tokyo (JP)

(72) Inventors: Tatsuya Ryoki, Kawasaki (JP); Kazuki Ohshitanai, Kawasaki (JP)

(73) Assignee: CANON KABUSHIKI KAISHA, Tokyo (JP)

(*) Notice: Subject to any disclaimer, the term of this patent is extended or adjusted under 35 U.S.C. 154(b) by 378 days.

(21) Appl. No.: 13/753,182

(22) Filed: Jan. 29, 2013

(65) Prior Publication Data

US 2013/0193310 A1 Aug. 1, 2013

(30) Foreign Application Priority Data

Jan. 31, 2012 (JP) ................. 2012-018413

(51) Int. Cl.
*H01L 27/146* (2006.01)
*H04N 5/347* (2011.01)
*H04N 5/345* (2011.01)
*H04N 5/374* (2011.01)
*H04N 5/378* (2011.01)

(52) U.S. Cl.
CPC ............ *H01L 27/146* (2013.01); *H04N 5/347* (2013.01); *H04N 5/3742* (2013.01); *H04N 5/3458* (2013.01); *H04N 5/374* (2013.01); *H04N 5/378* (2013.01)

(58) Field of Classification Search
CPC .... H01L 27/146; H04N 5/3458; H04N 5/347; H04N 5/374; H04N 5/3742; H04N 5/378
See application file for complete search history.

(56) References Cited

U.S. PATENT DOCUMENTS

2006/0158539 A1* 7/2006 Koizumi et al. .............. 348/300

FOREIGN PATENT DOCUMENTS

| CN | 1675921 A | 9/2005 |
|---|---|---|
| CN | 1812507 A | 8/2006 |
| CN | 101753864 A | 6/2010 |
| JP | H06-268920 A | 9/1994 |
| JP | 2005-333462 A | 12/2005 |
| JP | 2009-224524 A | 10/2009 |
| JP | 2010-016782 A | 1/2010 |
| JP | 2010-068123 A | 3/2010 |

* cited by examiner

*Primary Examiner* — Francis M Legasse, Jr.
(74) *Attorney, Agent, or Firm* — Canon USA, Inc. IP Division

(57) ABSTRACT

A photoelectric conversion apparatus includes a plurality of pixels arranged in a matrix, a plurality of signal processing units each corresponding to a column of the matrix, and a signal line. Each of the plurality of signal processing units includes a first capacitance and a second capacitance that hold a signal, a switch provided between the signal line and the first capacitance, a capacitance adjustment unit electrically connected to the second capacitance, and a connection unit configured to electrically connect the first capacitance provided to one of signal processing units to the second capacitance provided to another one of the signal processing units.

30 Claims, 13 Drawing Sheets

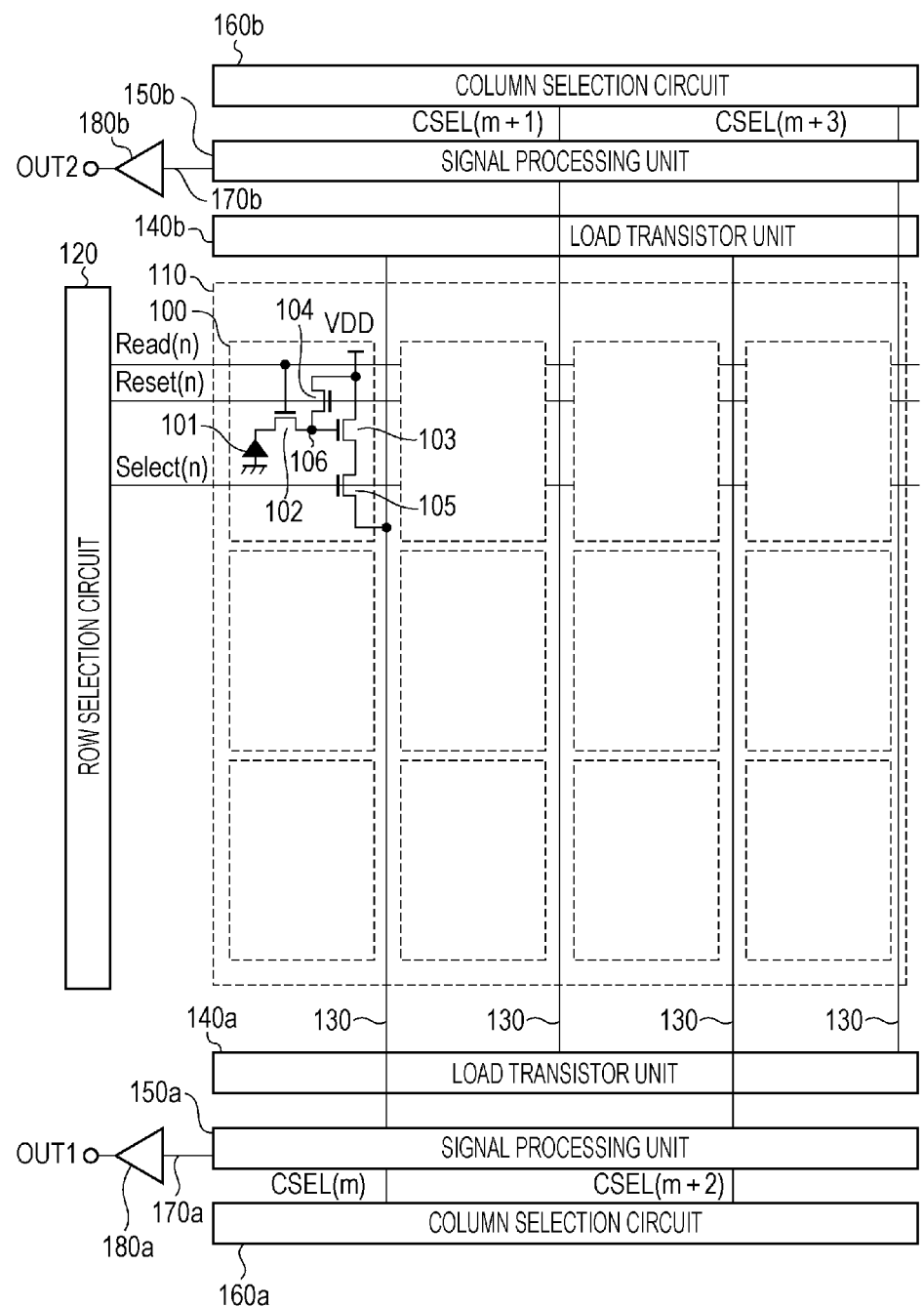

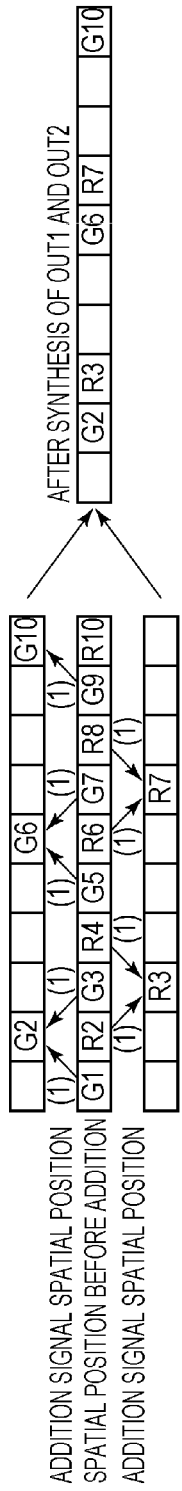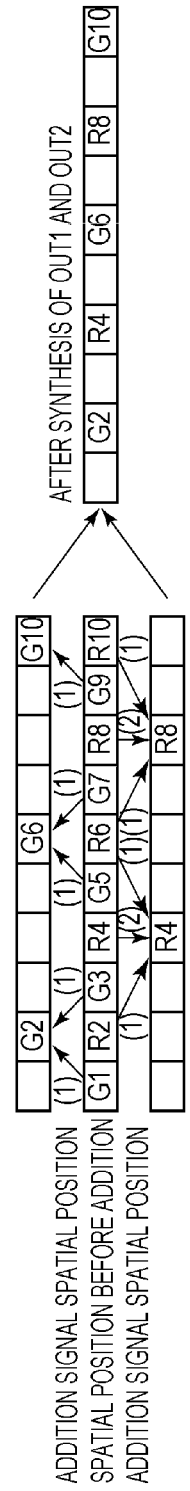

PHOTOELECTRIC CONVERSION APPARATUS THAT MAINTAINS IMAGE QUALITY AND IMAGE PICKUP SYSTEM

BACKGROUND OF THE INVENTION

1. Field of the Invention

The present invention relates to a photoelectric conversion apparatus. In particular, the invention relates to a photoelectric conversion apparatus provided with a function of adding a signal, and an image pickup system.

2. Description of the Related Art

A photoelectric conversion apparatus is used in photoelectric conversion apparatus such as a digital still camera or a digital camcorder. Various requests are made for the photoelectric conversion apparatus. One of the requests is an improvement in an output rate. To realize a high output rate, a technology is suggested in which signals based on plural pixels in the photoelectric conversion apparatus are added to each other to reduce the number of signals output from the photoelectric conversion apparatus. By adding the signals to each other, it is possible to obtain the high output rate while a decrease in an image quality caused by a decrease in a resolution is suppressed.

Japanese Patent Laid-Open No. 2010-68123 discloses an image pickup apparatus configured to add signals in a direction along a row and a direction along a column with respect to pixels arranged in a matrix manner. Japanese Patent Laid-Open No. 2010-68123 discloses a weighting addition conducted in a horizontal direction, that is, the direction along the row.

However, according to the configuration disclosed in Japanese Patent Laid-Open No. 2010-68123, the number of connected switches varies between two holding capacitors provided to the respective columns of the pixels, and a difference may be generated in capacitance values between the two holding capacitors. As a result, charge quantities held in the respective holding capacitors may be different from each other, and an image quality of a generated image may be degraded.

SUMMARY OF THE INVENTION

The present invention aims at suppressing the degradation in the image quality.

A photoelectric conversion apparatus according to an aspect of the present invention includes: a plurality of pixels arranged in plural columns; a plurality of signal processing units each of which is provided so as to correspond to the column; and a signal line, the signal processing unit including a first capacitance and a second capacitance that hold a signal based on the pixel on the corresponding column, a switch provided between the first capacitance and the signal line, a capacitance adjustment unit electrically connected to the second capacitance, and a connection unit configured to connect the first capacitance provided to one of the signal processing units to the second capacitance provided to another one of the signal processing units.

Further features of the present invention will become apparent from the following description of exemplary embodiments with reference to the attached drawings.

BRIEF DESCRIPTION OF THE DRAWINGS

FIG. 1 illustrates a configuration example of a photoelectric conversion apparatus according to an embodiment.

FIGS. 4A, 4B, and 4C illustrate a concept of an addition in a horizontal direction.

DESCRIPTION OF THE EMBODIMENTS

Figure 2A:
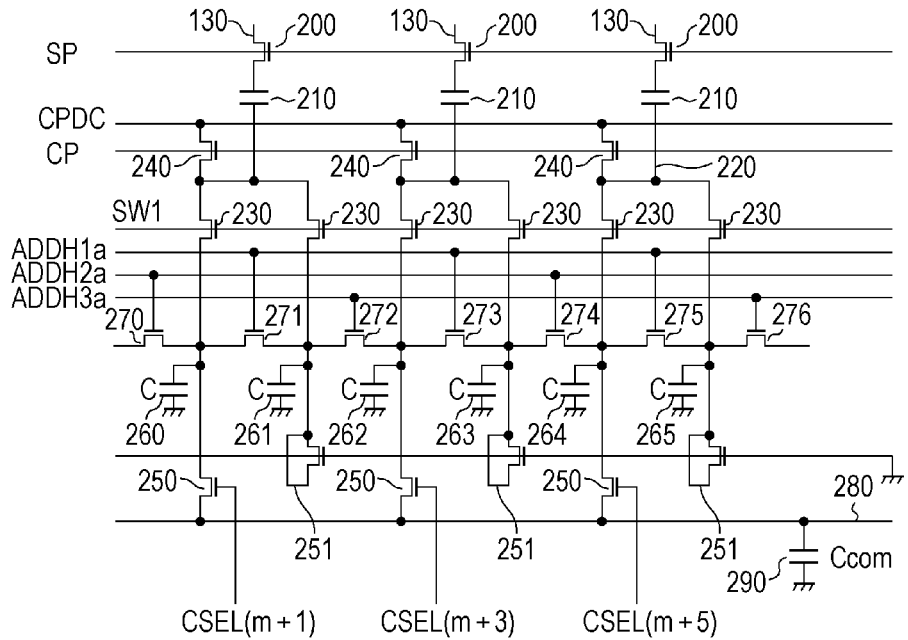
FIGS. 2A and 2B illustrate configuration examples of signal processing units according to a first exemplary embodiment.

In general, an averaging of signals can be used synonymously with an addition of signals. In the following exemplary embodiments, the averaging and the addition are collectively described as addition.

First Exemplary Embodiment

According to a first exemplary embodiment of the present invention, a photoelectric conversion apparatus operating in a weighting addition mode in a horizontal direction corresponding to a second operation mode in addition to an all pixel read mode corresponding to a first operation mode will be described as an example. The horizontal direction refers to a direction along a row in a pixel array where pixels are arranged in a matrix manner.

First, with reference to FIG. 1, a configuration example of the photoelectric conversion apparatus according to the present exemplary embodiment will be described. In a pixel array 110, pixels 100 are arranged in a matrix manner. Herein, a pixel array of three rows×four columns is illustrated. A row selection circuit 120 corresponding to a control unit is configured to supply signals Read, Reset, and Select to the pixel array to control an operation of the pixel 100. A signal that is output from the pixel 100 is transmitted to a first vertical signal line 130. The signal output to the first vertical signal line 130 is processed in signal processing units 150a and 150b that correspond to a read unit. The signals processed in the signal processing units 150a and 150b are transmitted via horizontal signals 170a and 170b to corresponding output amplifiers 180a and 180b to be output from output terminals OUT1 and OUT2. The signal processing units 150a and 150b are provided with circuits corresponding to the columns of the respective pixels. Column selection circuits 160a and 160b are configured to output a signal for selecting a column among the circuits included in the signal processing units 150a and 150b. Load transistor unit 140a and 140b, the signal processing units 150a and 150b, and the column selection circuits 160a and 160b are provided so as to sandwich the pixel array 110. A signal from a pixel in a column on an odd-number from the left of the pixel array (hereinafter, which will be referred to as odd-numbered column) is output from the output terminal OUT1 via the signal processing unit 150a, and a signal from a pixel in a column on an even-number from the left of the pixel array (hereinafter, which will be referred to as even-numbered column) is output from the output terminal OUT2 via the signal processing unit 150b. When a consideration is given of a single color photoelectric conversion apparatus, since filters of a same color are arranged every other pixel in a Bayer pattern, if attention is paid on a certain row, only signals based on the pixels of the same color are output when an attention is paid on each of the output terminals OUT1 and OUT2. The row selection circuit 120 and the column selection circuit 160 are both referred to as control unit. Also, for example, in a case where plural components are referred to such as the signal processing units 150a and 150b, a notation like the signal processing unit 150 is used.

Next, a configuration of the pixel 100 will be described. The respective pixels 100 included in the pixel array 110 include a photo diode 101, a transfer transistor 102, a reset transistor 104, an FD (Floating Diffusion) unit 106, an amplification transistor 103, and a selection transistor 105. The photo diode 101 corresponding to a photoelectric conversion unit is configured to generate and accumulate charges in accordance with an incident light quantity. The transfer transistor 102 corresponding to a transfer unit is configured to switch a conductive state or a non-conductive state between the photo diode 101 and the FD unit 106. A gate electrode of the amplification transistor 103 corresponding to a pixel output unit is connected to the FD unit 106. The reset transistor 104 corresponding to a reset unit is configured to switch the conductive state or the non-conductive state between a power supply VDD and a gate terminal of the amplification transistor 103. When the transfer transistor 102 and the reset transistor 104 are in the conductive state at the same time, the photo diode 101 is reset by the power supply VDD. During a period where the selection transistor 105 corresponding to a pixel selection unit is in the conductive state, the amplification transistor 103 forms a source follower circuit with a constant current source included in the load transistor unit 140. According to this, with regard to a first vertical signal line 130 corresponding to a first signal line, an output in accordance with a gate potential at the amplification transistor 103 at that time, in other words, a potential at the FD unit 106 appears on the first vertical signal. A signal Read for controlling the transfer transistor 102, a signal Reset for controlling the reset transistor 104, and a signal Select for controlling the selection transistor 105 are commonly provided from the row selection circuit 120 to pixels included in a same row.

Figure 2B:
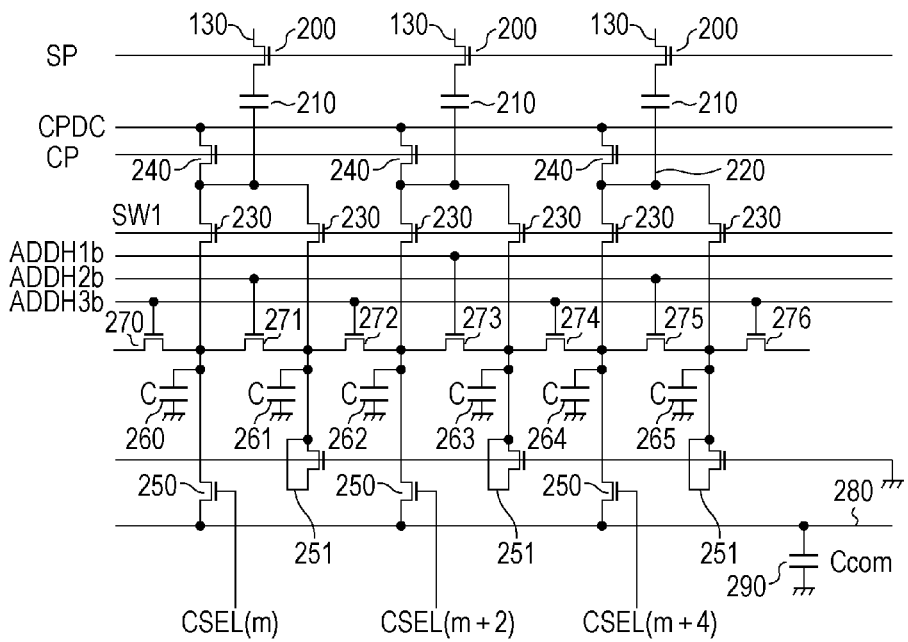

FIGS. 2A and 2B illustrate more specific configuration examples of the signal processing units 150a and 150b that correspond to the read unit. Herein, a part corresponding to an m-th column to an (m+5)-th column of the pixels is extracted. Although the signal processing units 150a and 150b are arranged so as to sandwich the pixel array 110, the configuration is the same as the signal processing unit 150a except that the connected columns of the pixels are different, and therefore a description thereof will be omitted. The respective columns of the pixels include a sample hold switch 200, sampling capacitors 260 to 265, a clamp capacitor 210, a clamp switch 240, a signal write switch 230, addition control switches 270 to 276, a column selection switch 250, and a dummy switch 251. The first vertical signal line 130 are connected to a second vertical signal line 220 via the sample hold switch 200 and the clamp capacitor 210. The sampling capacitors 260 to 265 are connected to the second vertical signal lines 220 respectively via switches 230. The addition control switches 270 to 276 are further connected to the sampling capacitors 260 to 265. Also, the sampling capacitors 260, 262, and 264 are connected to horizontal signal lines 280 respectively via the column selection switches 250. A horizontal signal line capacitance 290 is a capacitor provided to the horizontal signal line 280. The horizontal signal line capacitance 290 includes a parasitic capacitance associated with a wiring of the horizontal signal line 280 and a junction capacitance of a MOS transistor which is generated through a connection of the switch 250. On the other hand, the dummy switches 251 are connected to the sampling capacitors 261, 263, and 265. With the provision of the dummy switches 251, the number of switches connected to the sampling capacitors 260 to 265 are set uniform, and a difference in capacitance components observed from the sampling capacitors 260 to 265 is reduced. Also, a section between a source and a drain of the dummy switch 251 is short-circuited. Unlike the column selection switch 250, without the connection to the horizontal signal line 280, the dummy switch 251 does not increase the horizontal signal line capacitance 290, and a decrease in a circuit gain which will be described below is suppressed. Herein, the sampling capacitors 260, 262, and 264 are set as first capacitances, and the sampling capacitors 261, 263, and 265 are set as second capacitances. Also, like switches 272 and 274, a switch that connects the first capacitance and the second capacitance in different columns with each other is referred to as connection unit.

Figure 3:
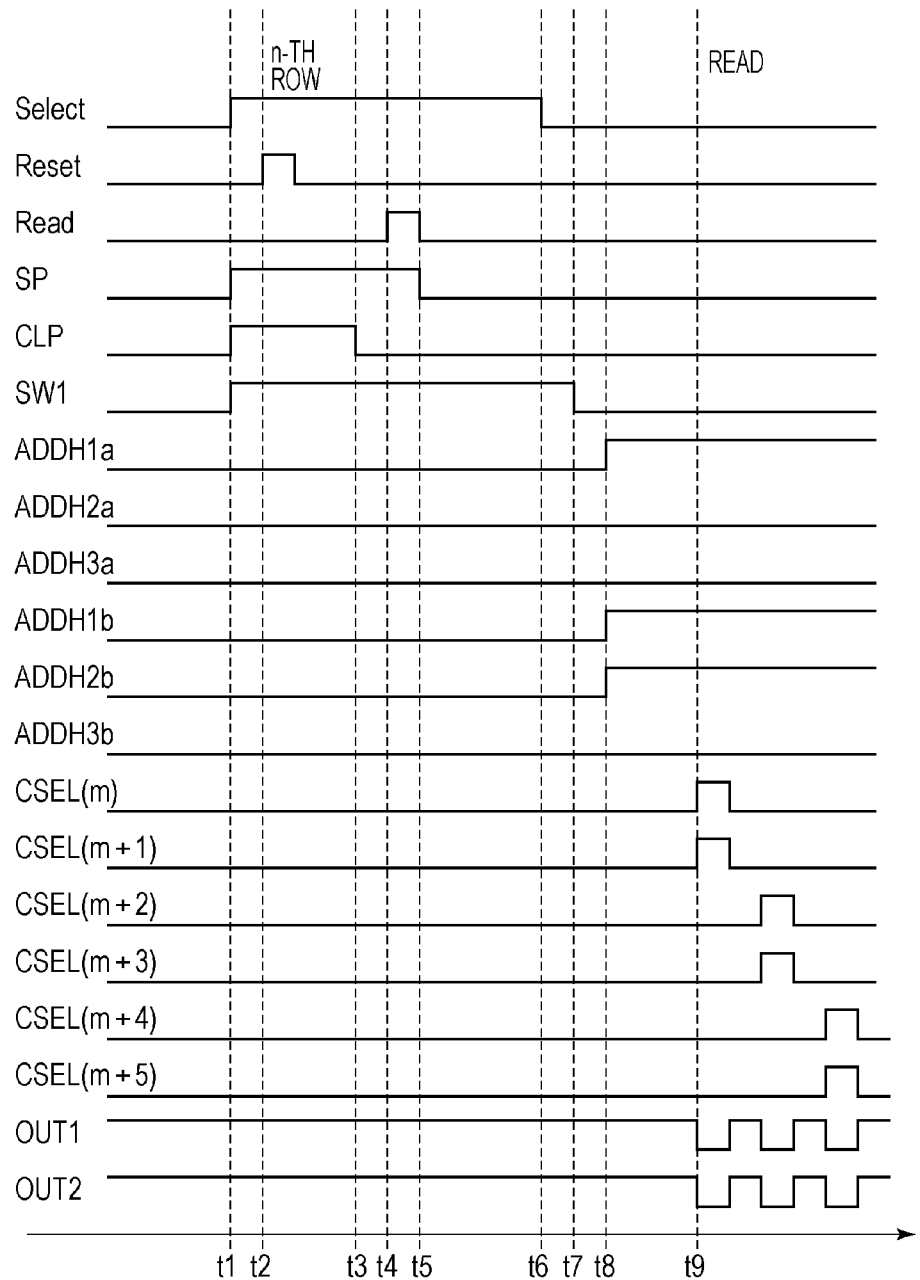
FIG. 3 illustrates an operation example in an all pixel read mode according to the first exemplary embodiment.

Next, an operation of reading a signal in the photoelectric conversion apparatus having the configuration illustrated in FIG. 1 and FIGS. 2A and 2B will be described. All pixel read mode First, an operation mode where an addition operation is not carried out will be described with reference to FIG. 3. Herein, this mode is referred to as all pixel read mode. However, all the pixels in the pixel array may not be read out, and this mode means that the addition operation is not carried out between the pixels.

At the time t1, the signal Select(n) is at the high level. According to this, since the selection transistor 105 included in the pixel in an n-th row is turned on and performs a source follower operation, a level corresponding to a potential at the gate electrode of the amplification transistor 103, that is, a potential at the FD unit 106 appears on the first vertical signal line 130. That is, at the time t1, a state in which the pixel in the n-th row is selected is started. Also, at the time t1, since signals SP and CLP are at the high level, a state is established in which the clamp capacitor 210 is provided with a potential difference between the level appearing on the first vertical signal line and a voltage CPDC.

When the signal Reset(n) is at the high level in a pulsed manner from a time t2, the potential at the FD unit 106 is reset in accordance with the power supply voltage VDD. According to this, a level corresponding to the reset of the FD unit 106 appears on the first vertical signal line 130 and a terminal A of the clamp capacitor 210.

When the signal CLP is at the low level at a time t3, since the clamp switch 240 is put into the non-conductive state, the second vertical signal line 220 is electrically floating. According to this, the clamp capacitor 210 holds a potential difference between the level corresponding to the reset of the FD unit 106 and the voltage CPDC.

When the signal Read(n) is at the high level at a time t4, the charges accumulated in the photo diode 101 are transferred to the FD unit 106. The potential at the FD unit 106 changes in accordance with the transferred charge amount, and the level corresponding to this appears on the first vertical signal line 130. The clamp capacitor 210 keeps holding the potential difference between the level corresponding to the reset of the FD unit 106 and the voltage CPDC. Therefore, the potential at the second vertical signal line 220 fluctuates by an amount obtained by applying a gain decided by the capacitance on a difference ΔVin between the level corresponding to the reset of the FD unit 106 and the level corresponding to the transfer of the charges from the photo diode 101 to the FD unit 106. When a capacitance value of the clamp capacitor 210 is set as Ccp, the voltage change ΔV generated in the second vertical signal line 220 is represented as follows.

$$\Delta V = (Ccp/(Ccp + 2 \cdot Csp)) \times \Delta Vin \quad (1)$$

The level corresponding to the reset of the FD unit 106 includes a noise component caused by the switching of the reset transistor 104 and a noise component unique to the transistor constituting the pixel. Also, since this noise component is superimposed on the level obtained from the transfer of the charges from the photo diode 101 to the FD unit 106 as well, it is possible to reduce the noise by carrying out the above-described operation by using the clamp capacitor 210.

When the signal SP is at the low level at a time t5, the sample hold switch 200 is in the non-conductive state, and the clamp capacitor 210 and the first vertical signal line 130 are put into the non-conductive state. According to this, Δv is held in the sampling capacitors 260 to 265.

The signal Select(n) is at the low level at a time t6, and the amplification transistor 103 included in the pixel 100 on the n-th row and the first vertical signal line 130 are put into the non-conductive state, so that the source follower operation ends. To elaborate, the state in which the pixel in the n-th row is selected ends.

At a time t8, ADDH1b, ADDH2b, and ADDH1a are at the high level. At this time, as illustrated in FIGS. 2A and 2B, the sampling capacitors provided to the respective columns, that is, the sampling capacitors 260 and 261, the sampling capacitors 262 and 263, and the sampling capacitors 264 and 265 are read out in a state of being respectively connected in parallel.

When signals CSEL(m), CSEL(m+1), ..., CSEL(m+5) are sequentially supplied from a time t9, the signals held in the sampling capacitors 260 to 265 on the respective columns are output to the horizontal signal line 280. When the signals held in the sampling capacitors 260 to 265 are output to the horizontal signal line 280, a gain decided by a ratio of the capacitances is applied. When a capacitance value of the horizontal signal line capacitance 290 is set as Ccom and a gain of the output amplifier 180 is set as Gamp, an output Vout appearing at the output terminal OUT is represented as follows.

$$Vout = \Delta V \times [Csp/(Csp + Ccom)] \times Gamp \quad (2)$$

With the provision of the dummy switches 251, since the capacitance values of the sampling capacitors 260 to 265 can be regarded as identical, all the capacitance values of the sampling capacitors are set as Csp as described above.

A similar operation is repeatedly conducted in a period "(n+1)-th row", a period "(n+2)-th row", and subsequent periods.

Weighting Addition Mode

Next, an operation mode where weighting is conducted in the horizontal direction to carry out the addition will be described.

Before an explanation on the weighting addition operation, an addition operation in which the weighting is not conducted will be described. FIG. 4C illustrates an array of the Bayer pattern color filters which are generally used in the color photoelectric conversion apparatus. R, G, and B denote filters through which lights of red, green, and blue are respectively transmitted. FIG. 4A illustrates an extraction of an array on an n-th row among these. A suffix indicates a position of the pixel counted from the left side of the drawing, and a number in brackets indicates a ratio at the time of the addition. In general, in the photoelectric conversion apparatus provided with the color filters, in a case where the addition in a direction along the row is conducted, signals from adjacent pixels among the pixels of the same color are added to each other. Therefore, in FIG. 4A, the addition is conducted in combinations of G1 and G3, R2 and R4, G5 and G7, R6 and R8, ..., for example.

If the signals of the two pixels are added to each other at a ratio of 1:1, a spatial gravity center position for the signals after G1 and G3 are added with each other is at a position denoted by G2 which is intermediate between G1 and G3. Similarly, spatial gravity center positions for the signals after the addition of R2 and R4, G5 and G7, and R6 and R8 appear on R3, G6, and R7, respectively. Therefore, the signal on the n-th row of the image synthesized by an image signal processing circuit or the like situated outside the photoelectric conversion apparatus has an arrangement illustrated on the right side of FIG. 4A. To elaborate, the spatial positions for the G and R pixels after the addition do not have an equal pitch but has an eccentric arrangement where the G and R pixels are close up to each other. The above-described eccentricity of the color gravity center may be a cause of an alias when an image of a subject having a high spatial frequency is picked up.

A method for improving the above-described eccentricity includes the weighting addition. By using FIG. 4B, a concept of the weighting addition will be described. In the weighting addition, three R pixels that are adjacently provided are added one another at a ratio of 1:2:1. That is, in the case of the pixels R2, R4, and R6, the pixels are added one another at a ratio of 1:2:1. According to this, the spatial gravity center position the R pixels after the addition is at a position denoted by R4. Similarly, the pixels R6, R8, and R10 are added one another at a ratio of 1:2:1. On the other hand, G pixels are added with each other at a ratio of 1:1 similarly as in the related art. Therefore, the signal on the n-th row obtained by the image signal processing circuit provided in a stage subsequent to the output terminal OUT has an arrangement illustrated on the right side of FIG. 4B, and the G pixels and the R pixels are arranged mutually at an equal pitch. According to this, an advantage is obtained in which it is more likely to avoid the generation of the alias that is generated in the case of the addition operation in which the weighting is not conducted.

Figure 5:
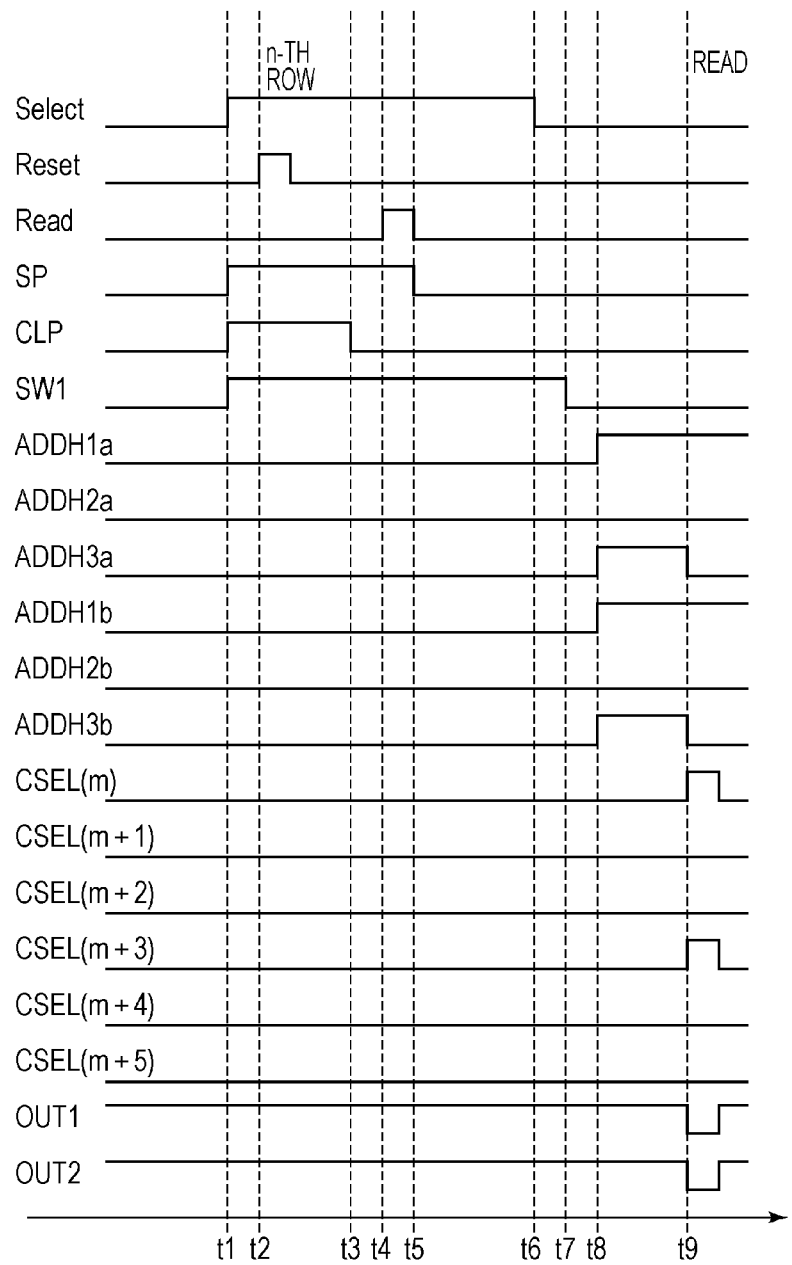
FIG. 5 illustrates an operation example in a weighting addition mode according to the first exemplary embodiment.

FIG. 5 illustrates an example of an operation timing in the weighting addition mode in the photoelectric conversion apparatus illustrated in FIG. 1 and FIGS. 2A and 2B. Here, a point different from the operation in the all pixel read mode illustrated in FIG. 3 will mainly be described. Among the sampling capacitors provided to the respective columns in the all pixel read mode, the sampling capacitors 260 and 261, the sampling capacitors 262 and 263, and the sampling capacitors 264 and 265 are treated as one pair of capacitors to hold the signal from one pixel. In contrast to this, a difference resides in that the sampling capacitors are divided into two to be utilized in the weighting addition mode. Respective operations by the signal processing units 150a and 150b will be described on the basis of FIGS. 2A and 2B. In the timing chart illustrated in FIG. 5, timings for signals ADDH2 and ADDH3 are different from the all pixel read mode.

First, in the signal processing unit 150a, an addition average signal of adjacent two columns is output. ADDH1a and ADDH3a are at the high level at the time t8, and addition switches 271, 272, 273, 275, and 276 are put into the conductive state. Since the sampling capacitors 260, 261, 262, and 263 are connected in parallel, the signals are added one another.

After that, ADDH3 is at the low level at the time t9, an average value of the signals held in the sampling capacitors 260, 261, 262, and 263 is held. To elaborate, an (m)-th column and an (m+2)-th column are added with each other at a ratio of 1:1. After that, when CSEL(m) is at the high level at a time t10, this is transmitted to the horizontal signal line 280 by a circuit gain represented by Expression (2).

Next, an operation by the signal processing unit 150b will be described. ADDH1b and ADDH3b are at the high level at the time t8, and the addition switches 270, 272, 273, 274, and 276 are put into the conductive state. Since the sampling capacitors 261, 262, 263, and 264 are connected in parallel, the signals are added one another.

After that, ADDH3b is at the low level at the time t9, and an average value of the signals held in the sampling capacitors 261, 262, 263, and 264 is held. To elaborate, the signals on the (m+1)-th column, the (m+3)-th column, and the (m+5)-th column are added one another at a ratio of 1:2:1. In the present example, with the provision of the dummy switches 251, since the capacitance values of the sampling capacitors 261, 262, 263, and 264 are adjusted to be substantially identical, it is possible to accurately realize the average at the above-described ratio of 1:2:1. For example, in a case where the dummy switch 251 is not provided, a fluctuation occurs in the parasitic capacitance by the amount corresponding to the switch. In a case where a junction capacitance of the column selection switch 250 is set as $\Delta Cp$, a ratio of the sampling capacitors added in the above-described addition is $(C+\Delta Cp):(2 \times C+\Delta Cp):C$. The balance of the weighting collapses from 1:2:1, which may lead to a decrease in the image quality of the obtained image. In particular, in a case where the values of the sampling capacitors 260 to 265 are not set high because of a miniaturization of an element or the like, an influence from the parasitic capacitance including the junction capacitance of the switch is not ignorable.

After that, when CSEL(m+3) is at the high level at the time t10, by the circuit gain illustrated in Expression (2), this is transmitted to the horizontal signal line 280. Subsequently, the signals are sequentially read out through the similar operation.

Through the above-described operation, the gravity centers after the addition of the G pixels and the R pixels are arranged mutually at an equal pitch, and it is more likely to avoid the generation of the alias caused by the displacement of the color gravity center.

Both the column selection switch 250 and the dummy switch 251 described above can be composed of MOS transistors. At this time, by setting the sizes of both the switches to be identical, it is easier to match the capacitance values associated with the first and second capacitances to each other.

It is noted that the dummy switches are provided as units configured to suppress the difference in the capacitance values of the sampling capacitors 260 to 265 on the respective columns according to the present exemplary embodiment, but the dummy switches may not be used. For example, by setting the capacitance values of the sampling capacitors 262 and 263 in a manner of (the capacitance value of the sampling capacitor 262)<(the capacitance value of the sampling capacitor 263), it is also possible to suppress the difference equivalent to the junction capacitance of the read switch 250. That is, by providing the capacitance adjustment unit configured to reduce the difference in the capacitance values of the two sampling capacitors, it is possible to accurately conduct the weighting addition, and the alias can be suppressed from the obtained image. The capacitance adjustment unit may be composed of a capacitor element, and the same applies to the following exemplary embodiments.

Figure 6:
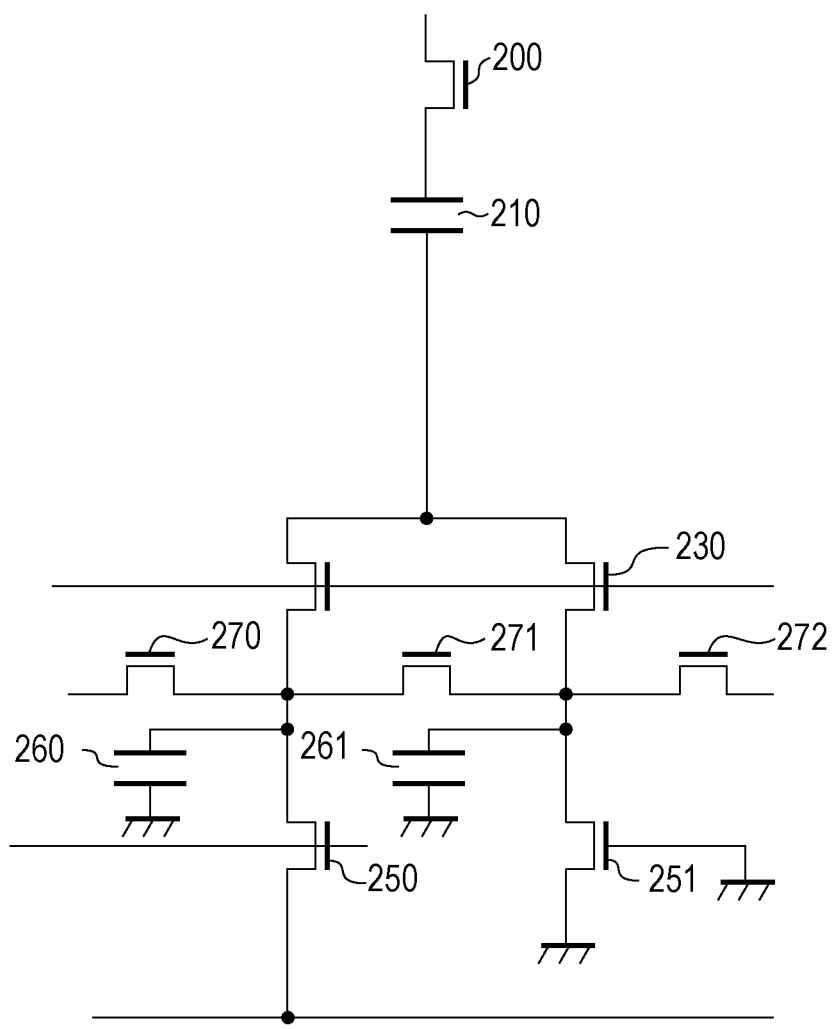
FIG. 6 illustrates another configuration example of the signal processing unit according to the first exemplary embodiment.

Also, according to the present exemplary embodiment, the main electrode between the source terminal and the drain terminal of the dummy switch is short-circuited so that the number of the horizontal signal line capacitances 290 is not increased. For example, it may suffice to adopt a configuration in which the number of the horizontal signal line capacitances 290 is not increased by connecting the source to a fixed potential as in the equivalent circuit for one column illustrated in FIG. 6.

Second Exemplary Embodiment

According to the first exemplary embodiment, the configuration has been described in which the noise component derived from the pixel is suppressed by using the clamp capacitor included in the signal processing unit. According to a second exemplary embodiment of the present invention, a configuration in which not only the noise component derived from the pixel is suppressed but also the signal can be amplified will be described. According to the present exemplary embodiment too, a description will be given while the photoelectric conversion apparatus that can operate in the weighting addition mode corresponding to the second mode in addition to the all pixel read mode corresponding to the first operation mode is taken as an example.

Figure 7:
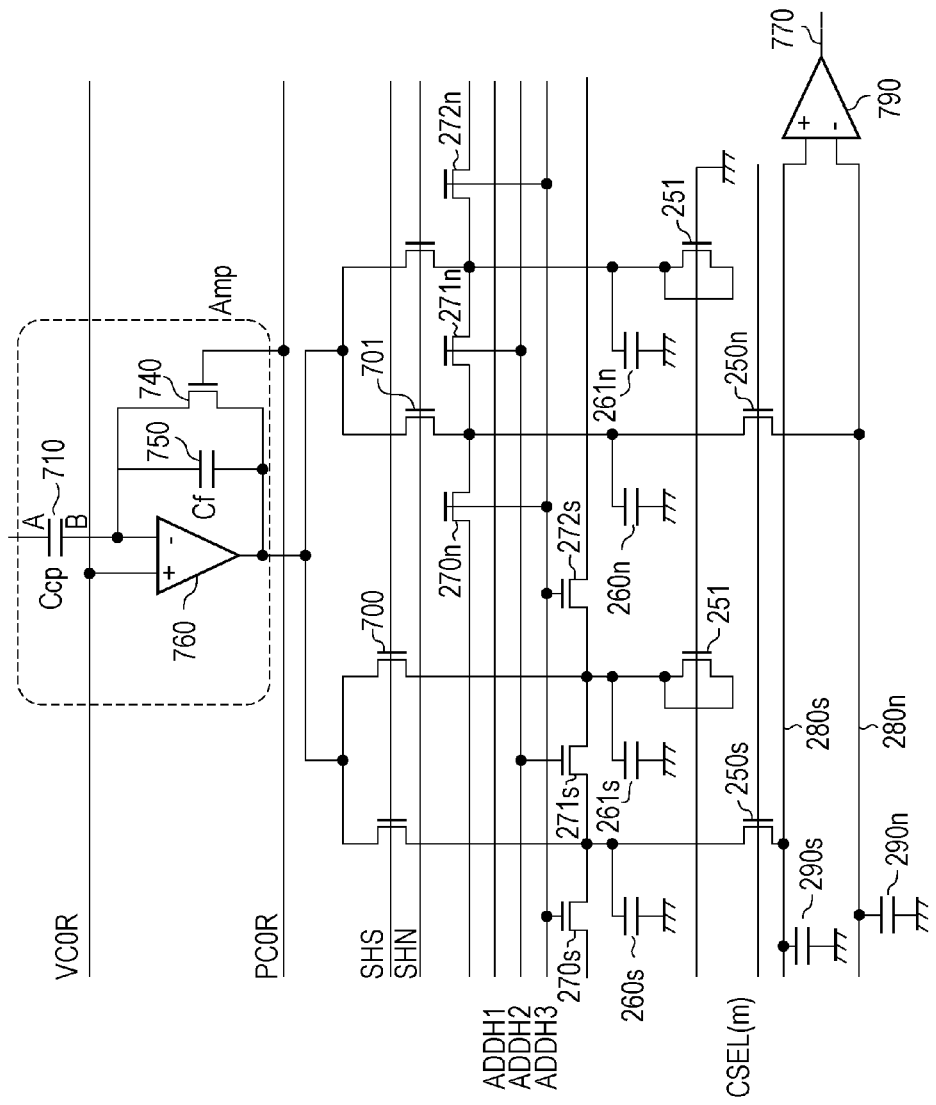
FIG. 7 illustrates another configuration example of the signal processing unit according to the first exemplary embodiment.

FIG. 7 illustrates an extraction of a circuit for one column among the signal processing unit according to the present exemplary embodiment. A column amplification unit Amp includes a clamp capacitor 710, a computation amplification unit 760, a short-circuit switch 740, and a feedback capacitor 750. A terminal A of the clamp capacitor 710 is connected to the first vertical signal line 130, and the other terminal B of the clamp capacitor 710 is connected to an inverting input terminal of the computation amplification unit 760 and also connected to one terminal of the feedback capacitor 750 and one electrode of the short-circuit switches 740. The other terminal of the feedback capacitor 750 is connected to the other electrode of the short-circuit switch 740 and an output terminal of the computation amplification unit 760. A non-inverting input terminal of the computation amplification unit 760 is supplied with a reference voltage VC0R. Also, the short-circuit switch is controlled by a signal PCOR. The signal PCOR is supplied, for example, from a timing control circuit unit that is not illustrated in the drawing. By providing plural feedback capacitors of the column amplification unit Amp and switching connections thereof, it is possible to set a variable amplification factor of the column amplification unit Amp. Also, as described below, the clamp capacitor 710 also functions as a noise reduction unit.

Sampling capacitors 260s and 261s and the sampling capacitors 260n and 261n are connected to the output terminal of the computation amplification unit 760, that is, the output terminal of the column amplification unit Amp via switches 700 and 701, respectively. Addition control switches 270s, 271s, and 272s and addition control switches 270n, 271n, and 272n are further connected to the sampling capacitors, respectively, and connected to the horizontal signal lines 280s and 280n via the column selection switches 250, respectively. The horizontal signal lines 280s and 280n have a capacitance value Ccom. The horizontal signal line capacitance schematically represents a capacitance that the first horizontal signal line has. The horizontal signal line 280s is connected to a non-inverting input terminal of a differential amplifier 790 in an output unit, and the horizontal signal line 280n is connected to an inverting input terminal of the differential amplifier 790.

The sampling capacitors 260s and 261s correspond to the first and second capacitances, respectively, which are described according to the first exemplary embodiment. Similarly, the sampling capacitors 260n and 261n correspond to the first and second capacitances, respectively, which are described according to the first exemplary embodiment. These sampling capacitors are connected to the second or first capacitance among the sampling capacitors on the other columns via the switches 270 and 272.

Figure 8:
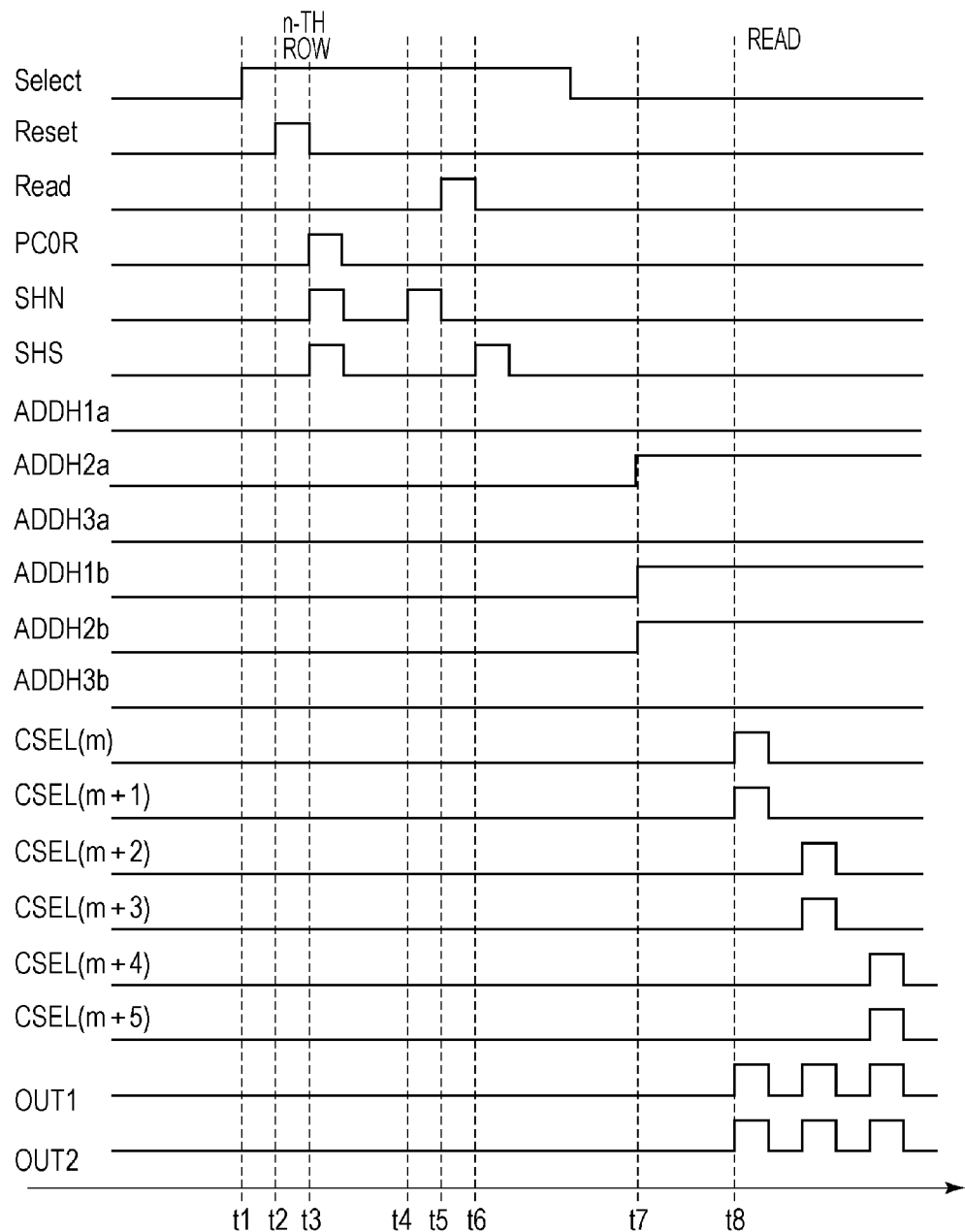
FIG. 8 illustrates an operation example in the all pixel read mode according to a second exemplary embodiment.

FIG. 7 illustrates the signal processing units 150a and 150b since the signal processing units 150a and 150b in FIG. 1 substantially have the same configuration. FIG. 7 illustrates the signals ADDH1, ADDH2, and ADDH3. In the timing chart described below, in the case of the signal processing unit 150a, ADDH1a, ADDH2a, and ADDH3a are given, and in the case of the signal processing unit 150b, ADDH1b, ADDH2b, and ADDH3b are given. The same applies to exemplary embodiments subsequent to the present exemplary embodiment. All pixel read mode Next, with reference to FIG. 8, an operation in the all pixel read mode will be described. It is noted that a pixel region connected to the first vertical signal line 130 is similar to that illustrated in FIG. 1.

When a signal Select(n) is at the high level at the time t1, the selection transistor included in the pixel in the n-th row is put into the conductive state, and the amplification transistor performs the source follower operation, so that the level corresponding to the potential at the gate electrode of the amplifier transistor, that is, the potential at the FD unit 106 appears on the first vertical signal line.

When a signal Reset(n) is at the high level in a pulsed manner from the time t2, the potential at the FD unit 106 is reset in accordance with the power supply voltage VDD. According to this, the level corresponding to the reset of the FD unit 106 appears on the first vertical signal line and the terminal A of the clamp capacitor. When the signal PCOR is at the high level in a pulsed manner from the time t3, the inverting input terminal of the computation amplification unit 760 and the output terminal are short-circuited by the short-circuit switch 740. At this time, the inverting input terminal of the computation amplification unit 760 has a potential of VC0R by the virtual ground of the computation amplification unit 760. To elaborate, both ends of the feedback capacitor 750 are reset to VC0R, and the terminal B of the clamp capacitor 710 also has VC0R.

Since signals SHS and SHN also are at the high level at the time t3, the sampling capacitor is reset by the output of the computation amplifier at this time. Subsequently, when the signal PCOR is at the low level, since the terminal B of the clamp capacitor is electrically floating, the clamp capacitor holds a voltage difference between the level corresponding to the reset of the FD unit 106 and the voltage VC0R.

When the signal SHN is at the high level in a pulsed manner from the time t4, the output of the column amplification unit Amp at this time is held in the sampling capacitors 260n and 261n. The signal held in the sampling capacitors 260n and 261n includes the offset component derived from the column amplification unit Amp.

When the signal Read(n) is at the high level in a pulsed manner from the time t5, the charges accumulated in the photo diode 101 are transferred to the FD unit 106. The potential at the FD unit 106 changes in accordance with the transferred charge amount, and the level corresponding to this appears on the first vertical signal line 130. Since the clamp capacitor keeps holding the potential difference between the level corresponding to the reset of the FD unit 106 and the voltage PCOR, the potential at the terminal B of the clamp capacitor changes by the difference $\Delta$Vin between the level corresponding to the reset of the FD unit 106 and the level corresponding to the transfer of the charges from the photo diode 101 to the FD unit 106. A difference from the first exemplary embodiment resides in that a gain decided by a ratio of the capacitance values of the clamp capacitor and the feedback capacitance may be applied on $\Delta$Vin. To elaborate, when the capacitance value of the clamp capacitor is set as C0 and the capacitance value of the feedback capacitance is set as Cf, an output AmpOUT of the column signal unit Amp is represented as follows.

$$AmpOUT = (C0/Cf) \times \Delta Vin \qquad (3)$$

The level corresponding to the reset of the FD unit includes the noise component caused by the switching of the reset transistor 104 and the noise component unique to the transistor constituting the pixel. Therefore, it is possible to suppress the noise component derived from the pixel by carrying out the above-described operation by using the clamp capacitor. Furthermore, according to the present exemplary embodiment, the voltage change $\Delta$Vin can be amplified by the gain of C0/Cf.

The signal SHS is at the high level from the time t6, and after that, when the signal SHS is at the low level, the voltage represented by Expression (3) is held in the sampling capacitor. The signal held in the sampling capacitor includes the output offset of the column signal unit Amp.

The signal Select(n) is at the low level at a time t7, and the amplification transistor 103 included in the pixel 100 on the n-th row and the first vertical signal line 130 are put into the non-conductive state, so that the source follower operation ends. In other words, the state in which the pixel in the n-th row is selected ends.

The addition control switch is at the high level at the time t7, and the sampling capacitors on the respective columns are connected. From the time t8, when the signals CSEL(m) and CSEL(m+1) are sequentially supplied, the signal held in the sampling capacitor is output to the horizontal signal line. To output the signal held in the sampling capacitor to the horizontal signal line, a gain decided by a ratio of capacitances is applied. When a capacitance value of the horizontal signal line is set as CCom, a voltage Vs1 appearing on the horizontal signal line is represented as follows.

$$Vs1 = [Csp/(Csp+CCom)] \times (C0/Cf) \times \Delta Vin \qquad (4)$$

Similarly, the signal held in the sampling capacitor is output to the horizontal signal line and also a gain decided by a ratio of capacitances is applied. When the capacitance value of the horizontal signal line is set as CCom, a voltage Vn1 appearing on the horizontal signal line is represented as follows.

$$Vn1 = [Csp/(Csp+CCom)] \times (C0/Cf) \times VC0R \qquad (5)$$

A difference between Vs1 and Vn1 input to the differential amplifier is output from the output terminal OUT. Since both Vs1 and Vn1 include the output offset of the column amplification unit Amp, a signal where the output offset of the column amplification unit Amp is suppressed is output from the output terminal OUT.

Weighting Addition Mode

Figure 9:
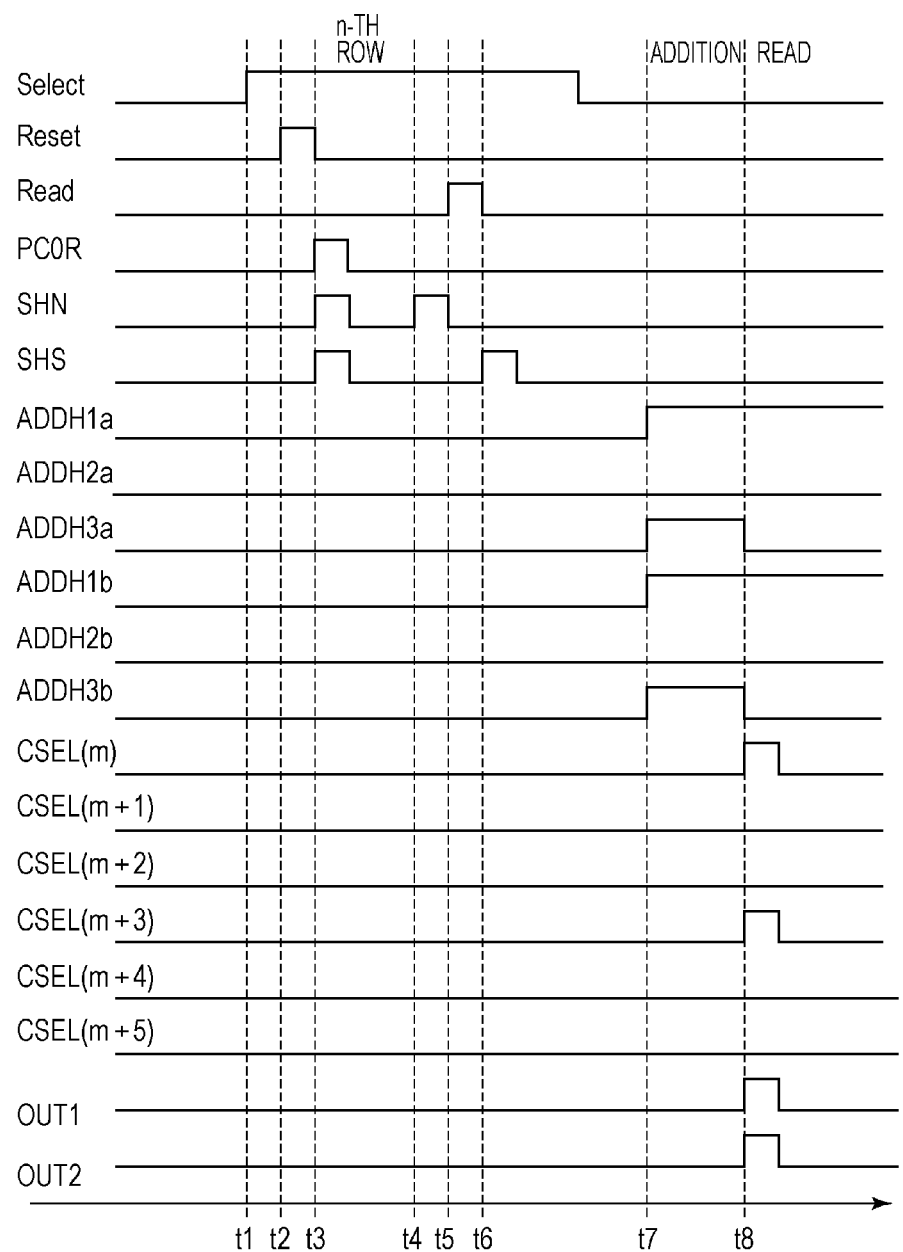
FIG. 9 illustrates an operation example in the weighting addition mode according to the second exemplary embodiment.

Next, the weighting addition mode will be described. FIG. 9 illustrates a drive pattern in the weighting addition mode. An operation of writing a signal to the sampling capacitor is similar to the all pixel read mode, and a description thereof will be omitted. Here, a point different from the all pixel read mode illustrated in FIG. 8 will mainly be described. In the all pixel read mode, two sampling capacitors on the respective columns are treaded as one capacitor. In contrast to this, in the weighting addition mode, a difference resides in that the sampling capacitors are respectively divided to be utilized. Similarly as in the first exemplary embodiment, a difference from the all pixel read mode resides in a signal control for an addition average period. In each of a signal path structured by the sampling capacitors 260s and 261s and a signal path structured by the sampling capacitors 260n and 261n, the addition averaging operation and the signal output are conducted similarly as in the operation illustrated in FIG. 5 according to the first exemplary embodiment.

With the above-described configuration according to the present exemplary embodiment of the present invention, the output can be conducted while the gain is applied in the read circuit, and it is possible to accurately carry out the weighting addition while the S/N ratio is further improved.

According to the present exemplary embodiment too, with the provision of the dummy switches 251, the capacitance values of the sampling capacitors 260s, 261s, 260n, and 261n are adjusted to be substantially identical. It is noted that according to the present exemplary embodiment too, by setting the capacitance values of the sampling capacitors 262 and 263 in a manner of (the capacitance value of the sampling capacitor 262)<(the capacitance value of the sampling capacitor 263), it is also possible to suppress the difference equivalent to the junction capacitance of the read switch 250. That is, by providing the capacitance adjustment unit configured to reduce the difference in the capacitance values of the two sampling capacitors, it is possible to accurately conduct the weighting addition, and the alias can be suppressed from the obtained image.

Also, according to the present exemplary embodiment, the section between the source and the drain of the dummy switch is short-circuited so that the number of the horizontal signal line capacitances 290 is not increased. For example, it may suffice to adopt a configuration in which the number of the horizontal signal line capacitances 290 is not increased by connecting the source to a fixed potential as in the equivalent circuit for one column illustrated in FIG. 6.

Third Exemplary Embodiment

Next, a third exemplary embodiment of the present invention will be described. A significant difference from the second exemplary embodiment resides in a configuration of the signal processing unit. The signal processing unit according to the present exemplary embodiment has a third capacitance as well as the first and second capacitances. In addition, it is characterized in that a first process of holding a signal supplied from the first vertical signal line in the third capacitance and a second process of outputting a signal held in the first capacitance to the signal line are carried out at least partly in parallel in terms of time. According to the present exemplary embodiment, the vertical addition operation and the horizontal addition averaging operation can be carried out.

Figure 10:
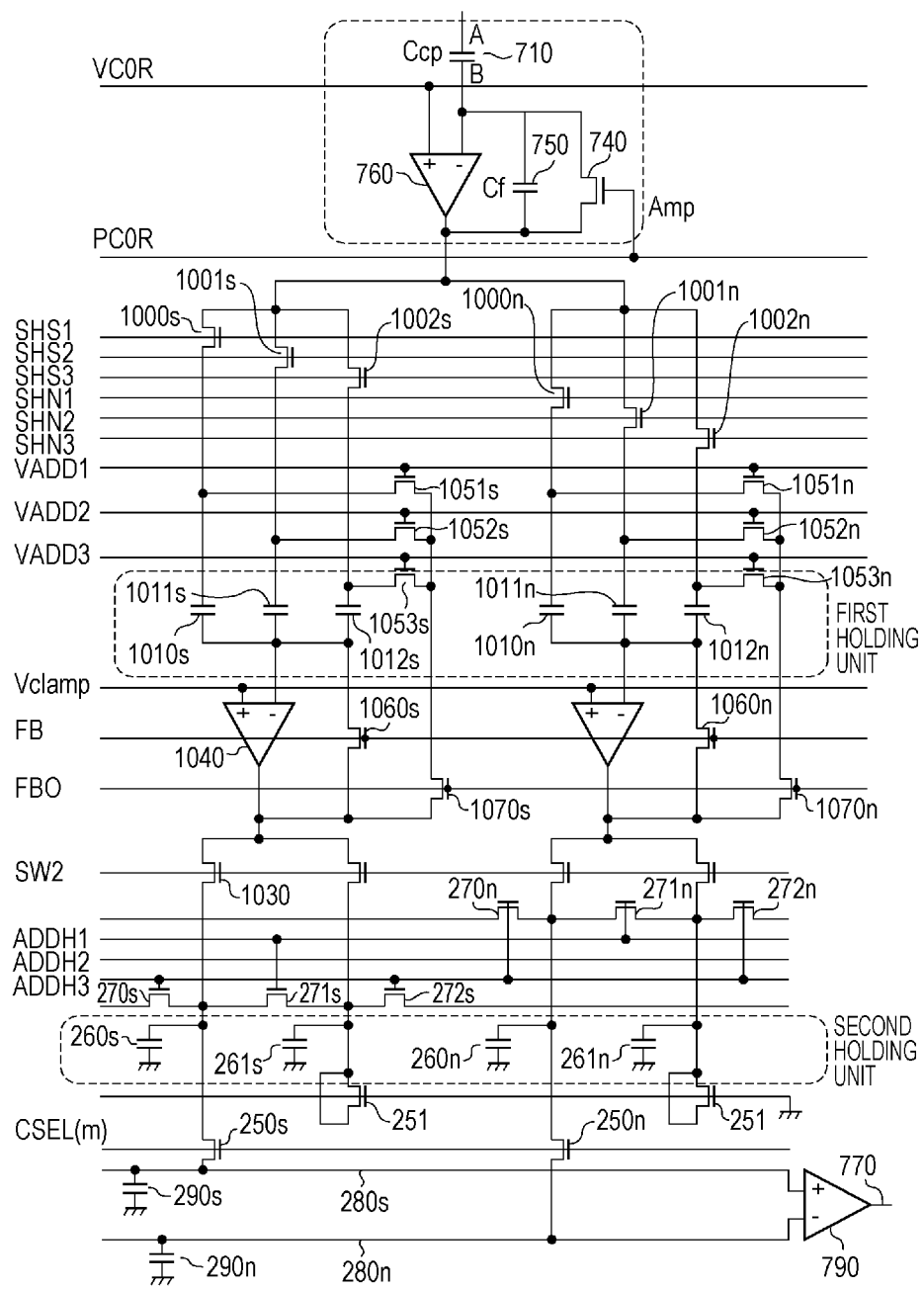
FIG. 10 illustrates a configuration example of the signal processing unit according to a third exemplary embodiment.

FIG. 10 illustrates a configuration for one column of the signal processing unit according to the present exemplary embodiment. A point different from the second exemplary embodiment resides in that third capacitances 1010s, 1011s, and 1012s, and third capacitances 1010n, 1011n, and 1012n corresponding to a first holding unit are provided mutually in parallel. A differential amplifier 1040 functioning as a buffer unit is provided between the third holding capacitor and the first and second capacitances.

In both the pairs of the third capacitances 1010s, 1011s, and 1012s, and the third capacitances 1010n, 1011n, and 1012n, one terminals are mutually short-circuited and connected to an inverting input terminal of the differential amplifier 1040. The other terminals of the third capacitances are connected to common nodes 1060s and 1060n via switches 1051s, 1052s, and 1053s and switches 1051n, 1052n, and 1053n, respectively. Furthermore, the other terminals are connected to an output terminal of the differential amplifier 1040 via 1070s and 1070n.

The sampling capacitors 260s and 261s respectively correspond to the first and second capacitances described according to the first exemplary embodiment. Similarly, the sampling capacitors 260n and 261n respectively correspond to the first and second capacitances described according to the first exemplary embodiment. These sampling capacitors are connected to the second or first capacitance among the sampling capacitors on the other columns via the switches 270 and 272.

As represented by Expression (2) described above, it is difficult to set the first and second capacitances low because the gain on the signal transmitted to the signal line is not to be decreased, but the same does not apply to the third capacitance. Therefore, a capacitance value of the third capacitance can be set lower than the capacitance value of the first capacitance.

All Pixel Read Mode

Figure 11:
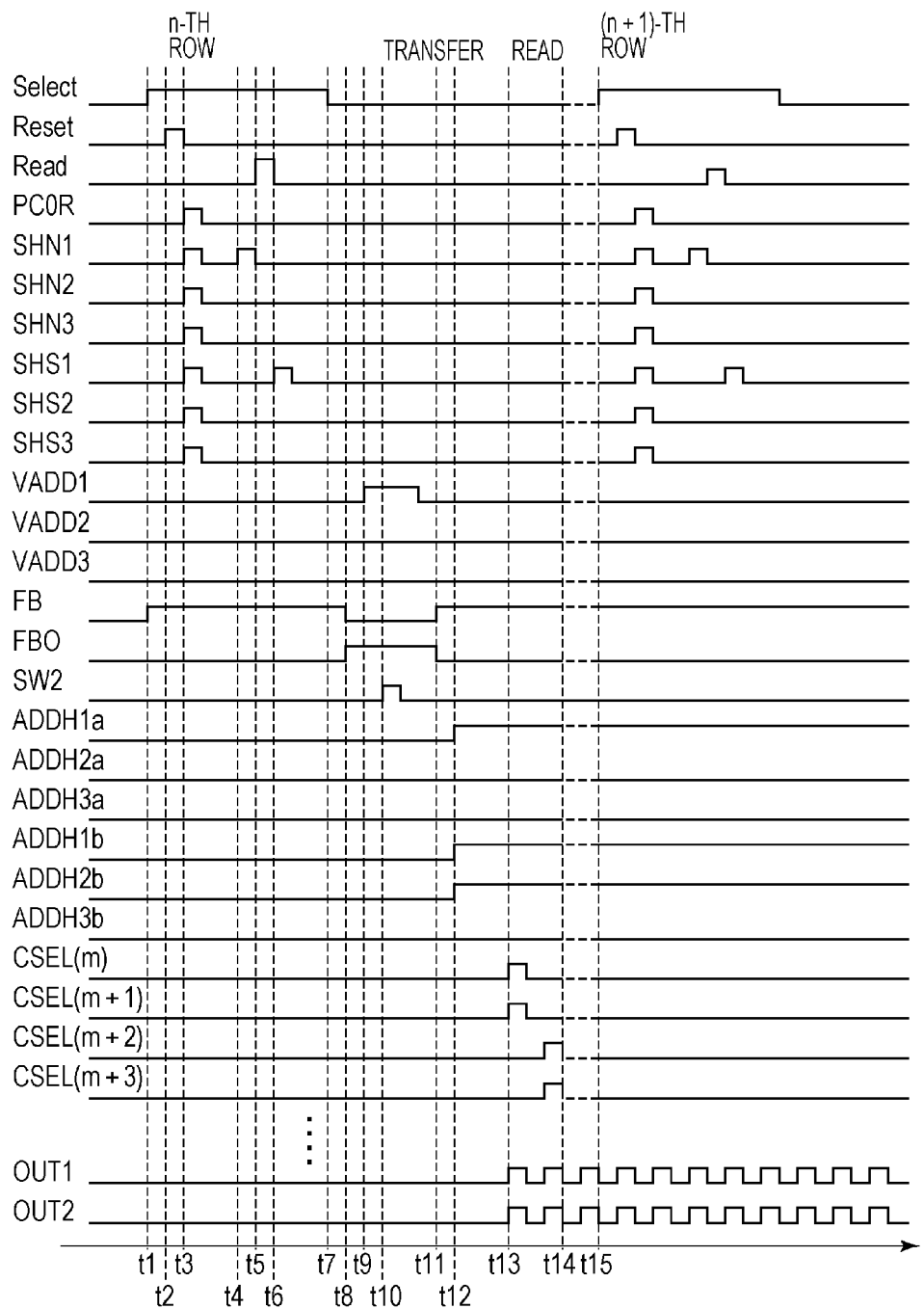
FIG. 11 illustrates an operation example in the all pixel read mode according to the third exemplary embodiment.

FIG. 11 illustrates a timing chart for describing an operation at the time of the all pixel read mode. A pixel region connected to the first vertical signal line 130 is similar to that illustrated in FIG. 1.

When the signal Select(n) is at the high level at the time t1, the selection transistor included in the pixel in the n-th row is put into the conductive state, and the source follower operation is carried out. Thus, the level corresponding to the potential at the gate electrode of the amplifier transistor, that is, the potential at the FD unit 106 appears on the first vertical signal line.

When the signal Reset(n) is at the high level in a pulsed manner from the time t2, the potential at the FD unit 106 is reset in accordance with the power supply voltage VDD. According to this, the level corresponding to the reset of the FD unit 106 appears on the first vertical signal line and the terminal A of the clamp capacitor.

When the signal PCOR is at the high level in a pulsed manner from the time t3, the inverting input terminal of the computation amplification unit 760 and the output terminal are short-circuited by the short-circuit switch 740. At this time, the inverting input terminal of the computation amplification unit 760 has the potential of VC0R by the virtual ground of the computation amplification unit 760. To elaborate, both ends of the feedback capacitor 750 are reset to VC0R, and the terminal B of the clamp capacitor 710 also has VC0R. Since signals SHS1, SHS2, and SHS3, and signals SHN1, SHN2, and SHN3 also are at the high level at the time t3, the sampling capacitor is reset by the output of the computation amplifier at this time. Subsequently, when the signal PC0R is at the low level, since the terminal B of the clamp capacitor is electrically floating, the clamp capacitor holds the voltage difference between the level corresponding to the reset of the FD unit 106 and the voltage VC0R.

From the time t4, the signal SHN1 is at the high level in a pulsed manner, the output of the column amplification unit Amp at this time is held in the first holding capacitors 1010n, 1011n, and 1012n. The signal held in the first holding capacitors 1010n, 1011n, and 1012n includes the output offset of the column amplification unit Amp. When the signal Read(n) is at the high level in a pulsed manner at the time t5, the charges accumulated in the photo diode 101 are transferred to the FD unit 106. The potential at the FD unit 106 changes in accordance with the transferred charge amount, and the level corresponding to this appears on the first vertical signal line 130. Since the clamp capacitor keeps holding the potential difference between the level corresponding to the reset of the FD unit 106 and the voltage PCOR, the potential at the terminal B of the clamp capacitor changes by the difference ΔVin between the level corresponding to the reset of the FD unit 106 and the level corresponding to the transfer of the charges from the photo diode 101 to the FD unit 106. This can be represented by Expression (3) as described according to the second exemplary embodiment.

The signal SHS1 is at the high level from the time t6, and after that, when the signal SHS1 is at the low level, the voltage represented by Expression (3) is held in the first holding capacitor 1010s. The signal held in the first holding capacitor 1010s includes the output offset of the column signal unit Amp.

The signal Select(n) is at the low level at the time t7, and the amplification transistor 103 included in the pixel 100 on the n-th row and the first vertical signal line 130 are put into the non-conductive state, so that the source follower operation ends.

On the other hand, a signal FB is at the high level at the time t1, and the switches 1060s and 1060n are put into the conductive state. According to this, a potential VC1Amp at an electrode of the first holding capacitor connected to the inverting input terminal of the differential amplifier 1040 is at a level on which the output offset of the differential amplifier 1040 is superimposed.

At the time t8, a signal FB is at the low level, and a signal FBO is at the high level. After that, a state is established in which the output terminal of the differential amplifier 1040 is electrically connected to the second holding capacitor where a signal VADD1 is at the high level at the time t9 and a signal SW2 is at the high level at the time t10. With this operation, a signal from which the output offset of the differential amplifier 1040 is removed appears on the output terminal of the differential amplifier 1040. From a time t12 and a subsequent time, similarly as in the second exemplary embodiment, the signal is read out from the second holding capacitor to the horizontal signal line.

On the other hand, read of an "(n+1)-th row" is started from a time t15. Through the operation on the "n-th row" illustrated from the time t1 to the time t7, a part of the operation of reading the signal on the "n-th row" from the second holding capacitor to the horizontal signal line is conducted in parallel with the operation of holding the signal on the "(n+1)-th row" in the first holding capacitor.

According to the present exemplary embodiment, since the first process of holding the signal from the pixel in the first holding capacitor and the second process of outputting the signal held in the second holding capacitor to the horizontal output line are carried out at least partly in an overlapping manner, a period where the signal is not output spans from the time t8 to a time t13, so that a reading speed of the pixel signal can be improved.

Weighting Addition Mode

Figure 12:
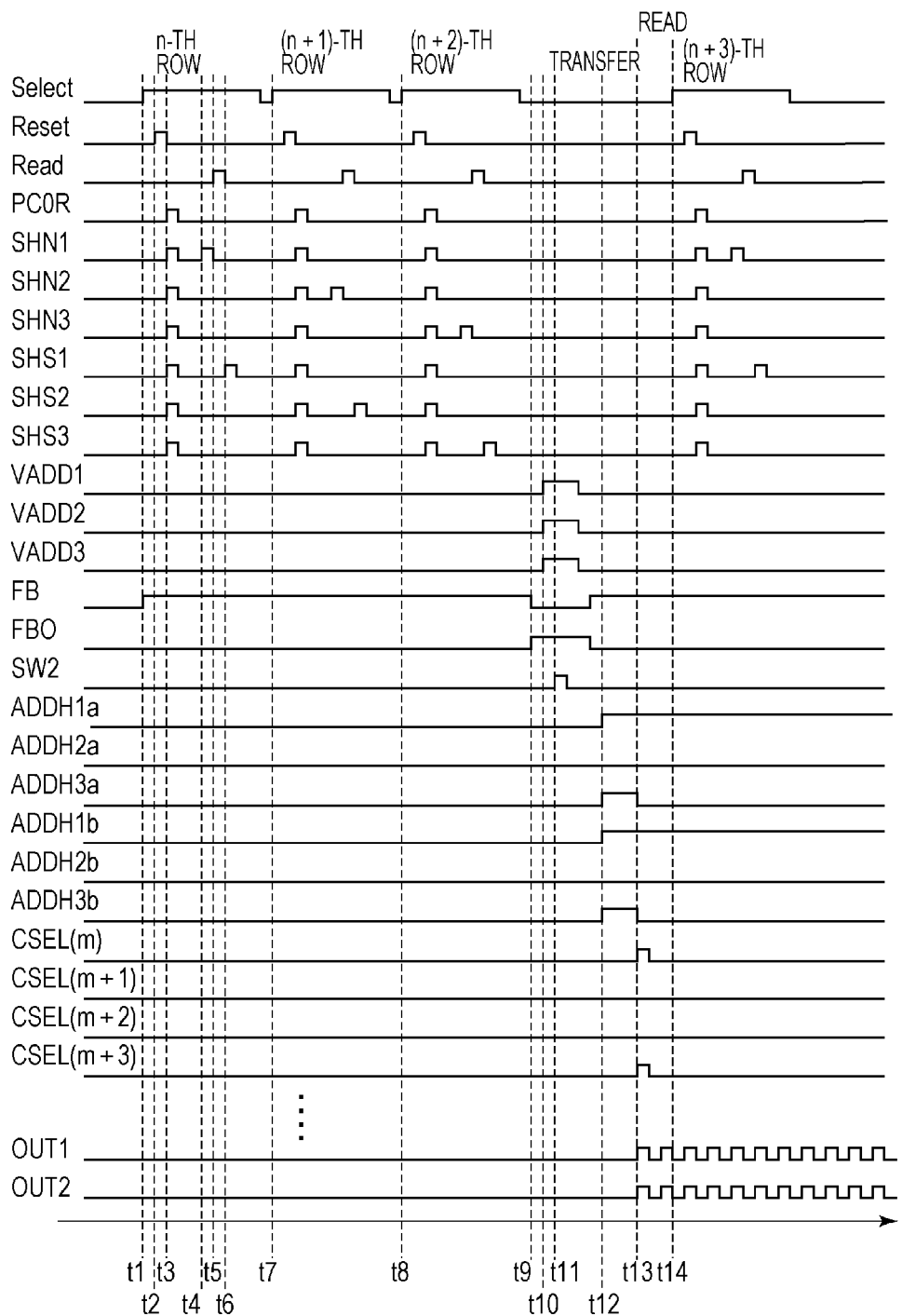
FIG. 12 illustrates an operation example in the weighting addition mode according to the third exemplary embodiment.

Next, with reference to a timing chart of FIG. 12, a vertical three-row addition mode and the weighting addition mode will be described.

When the signal Select is at the high level at the time t1, the selection transistor included in the pixel in the n-th row is put into the conductive state, and the amplification transistor performs the source follower operation, so that the level corresponding to the potential at the gate electrode of the amplifier transistor, that is, the potential at the FD unit 106 appears on the first vertical signal line.

When the signal Reset is at the high level in a pulsed manner from the time t2, the potential at the FD unit 106 is reset in accordance with the power supply voltage VDD. According to this, the level corresponding to the reset of the FD unit 106 appears on the first vertical signal line and the terminal A of the clamp capacitor.

When the signal PCOR is at the high level in a pulsed manner from the time t3, the inverting input terminal of the computation amplification unit 760 and the output terminal are short-circuited by the short-circuit switch 740. At this time, the inverting input terminal of the computation amplification unit 760 has the potential of VC0R by the virtual ground of the computation amplification unit 760. To elaborate, both ends of the feedback capacitor 750 are reset to VC0R, and the terminal B of the clamp capacitor 710 also has VC0R. Since the signals SHS1, SHS2, and SHS3 and the signals SHN1, SHN2, and SHN3 are also at the high level at the time t3, the sampling capacitor is reset by the output of the computation amplifier at this time. Subsequently, when the signal PCOR is at the low level, since the terminal B of the clamp capacitor is electrically floating, the clamp capacitor holds a voltage difference between the level corresponding to the reset of the FD unit 106 and the voltage VC0R.

From the time t4, if the signal SHN1 is at the high level in a pulsed manner, as described in the all pixel read mode, the output of the column amplification unit Amp at this time is held in the first holding capacitor 1010n. From the time t5, the signal Read(n) is at the high level in a pulsed manner, the charges accumulated in the photo diode 101 are transferred to the FD unit 106. The potential at the FD unit 106 changes in accordance with the transferred charge amount, and the level corresponding to this appears on the first vertical signal line 130. Since the clamp capacitor holds the potential difference between the level corresponding to the reset of the FD unit 106 and the voltage PCOR, the potential at the terminal B of the clamp capacitor changes by the difference ΔVin between the level corresponding to the reset of the FD unit 106 and the level corresponding to the transfer of the charges from the photo diode 101 to the FD unit 106. As described according to the second exemplary embodiment, the output of the column amplification unit is represented by Expression (3).

The signal SHS1 is at the high level from the time t6, and after that, when the signal SHS1 is at the low level, the voltage represented by Expression (3) is held in the sampling capacitor 1010s.

Select is at the high level in a pulsed manner at the time t7, and the above-described operation is repeatedly conducted, so that the sampling capacitors 1011n and 1011s respectively hold a reset signal of the pixel on the (n+1)-th row and an optical signal.

From the time t8, similarly, the first holding capacitors 1012n and 1012s respectively hold a reset signal of the pixel on the (n+2)-th row and the optical signal.

At the time t9, the signal FB is at the low level, and a signal FBO is at the high level.

After that, when the signals VADD1, VADD2, and VADD3 are at the high level at the time t10, the electrode of the first holding capacitor is electrically held, and the signals for the three rows which are held in the first holding capacitors 1010s, 1011s, and 1012s and the first holding capacitors 1010n, 1011n, and 1012n are respectively averaged. Also, at a time t11, since SW2 is at the high level, the second holding capacitor and the sampling capacitors 260s and 261s hold the averaged signal of the first holding capacitors 1010s, 1011s, and 1012*s*, and the sampling capacitors 260*n* and 261*n* hold the averaged signal of the first holding capacitors 1010*n*, 1011*n*, and 1012*n*.

Also, the addition average of the pixel signals in the horizontal direction at the time t12 and the read of the signal to the horizontal output line from the time t13 are respectively executed in an operation similar to that described according to the first exemplary embodiment. On the other hand, similarly as in the all pixel read mode, at a time t14, the first process of holding the signal from the pixel in the first holding capacitor and the second process of outputting the signal held in the second holding capacitor to the horizontal output line are carried out at least partly in parallel in terms of time.

According to the present exemplary embodiment too, with the provision of the dummy switches 251, the capacitance values of the sampling capacitors 260*s*, 261*s*, 260*n*, and 261*n* are adjusted to be substantially identical. It is noted that according to the present exemplary embodiment too, by setting the capacitance values of the sampling capacitors 262 and 263 in a manner of (the capacitance value of the sampling capacitor 262)<(the capacitance value of the sampling capacitor 263), it is also possible to suppress the difference equivalent to the junction capacitance of the read switch 250. That is, by providing the capacitance adjustment unit configured to reduce the difference in the capacitance values of the two sampling capacitors, it is possible to accurately conduct the weighting addition, and the alias can be suppressed from the obtained image.

Also, according to the present exemplary embodiment, the section between the source and the drain of the dummy switch is short-circuited so that the number of the horizontal signal line capacitances 290 is not increased. For example, it may suffice to adopt a configuration in which the number of the horizontal signal line capacitances 290 is not increased by connecting the source to a fixed potential as in the equivalent circuit for one column illustrated in FIG. 6.

According to the present exemplary embodiment, the averaging in the vertical direction is conducted in the first holding capacitor, and it is possible to suppress jaggy. The first process of holding the signal from the pixel in the first holding capacitor and a third process of outputting the signal held in the second holding capacitor to the horizontal output line are carried out at least partly in parallel. According to this, since the signals can be read out while the signals from the plural pixels on the same column are added one another, it is possible to improve the frame rate while the jaggy is suppressed.

Fourth Exemplary Embodiment

Figure 13:
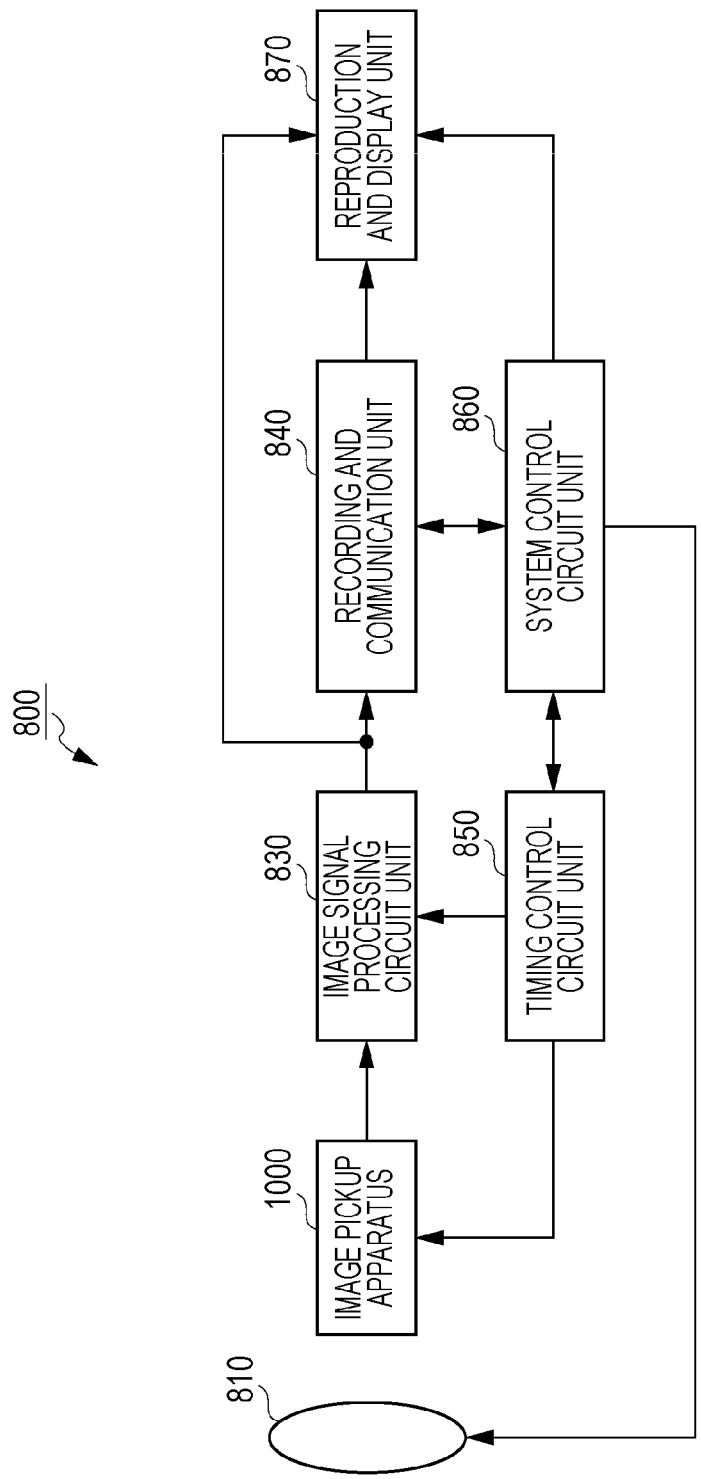
FIG. 13 illustrates a configuration example of an image pickup system according to an embodiment.

Next, an outline of an image pickup system according to the present exemplary embodiment will be described by using FIG. 13.

An image pickup system 800 includes, for example, an optical unit 810, an image pickup apparatus 1000, an image signal processing circuit unit 830, a recording and communication unit 840, a timing control circuit unit 850, a system control circuit unit 860, and a reproduction and display unit 870. For the image pickup apparatus 1000, the photoelectric conversion apparatus described according to the above-described respective exemplary embodiments is used. Here, a case will be exemplified in which the timing generator is included in the timing control circuit unit 850 instead of the image pickup apparatus.

The optical unit 810 corresponding to an optical system such as a lens forms an image of light from a subject onto a pixel array of the image pickup apparatus 1000 where plural pixels are arranged in a two-dimensional manner to form an image of the subject. The image pickup apparatus 1000 outputs a signal in accordance with the light imaged on the pixel unit at a timing based on a signal from the timing control circuit unit 850.

The signal that is output from the image pickup apparatus 1000 is input to the image signal processing circuit unit 830 functioning as an image signal processing, and the image signal processing circuit unit 830 performs a processing such as an AD conversion on the input electric signal while following a method determined by a program or the like. The signal obtained through the processing in image signal processing circuit unit is sent to the recording and communication unit 840 as image data. The recording and communication unit 840 sends the signal for forming the image to the reproduction and display unit 870, and a movie or a still image is reproduced and displayed on the reproduction and display unit 870. The recording and communication unit receives the signal from the image signal processing circuit unit 830 and communicates with the system control circuit unit 860 as well and also performs an operation of recording the signal for forming the image in a recording medium that is not illustrated in the drawing.

The system control circuit unit 860 is configured to control an operation of the image pickup system in an overall manner and control drives of the optical unit 810, the timing control circuit unit 850, the recording and communication unit 840, and the reproduction and display unit 870. Also, the system control circuit unit 860 is provided, for example, with a storage apparatus corresponding to a recording medium that is not illustrated in the drawing and records therein a program or the like that is used for controlling the operation by the image pickup system. Also, the system control circuit unit 860 supplies a signal, for example, for switching a drive mode in accordance with a user operation within the image pickup system. As a specific example, the control includes a change of a row to be read or a row to be reset, a change of a field angle associated with an electronic zoom, a shift of the field angle associated with an electronic image stabilizing, and the like.

The timing control circuit unit 850 is configured to control driving timings of the image pickup apparatus 1000 and the image signal processing circuit unit 830 on the basis of a control by the system control circuit unit 860 corresponding to a control unit.

The image signal processing circuit unit 830 holds the correction coefficient described according to the respective above-described exemplary embodiments and performs a correction processing on the signal that is output from the image pickup apparatus 1000.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-018413 filed Jan. 31, 2012, which is hereby incorporated by reference herein in its entirety.

What is claimed is:

1. A photoelectric conversion apparatus comprising:
a plurality of pixels arranged in a matrix;
a plurality of signal processing units each corresponding to a column of the matrix; and
a signal line,
wherein each of the plurality of signal processing units includes
a first capacitance and a second capacitance that hold a signal based on the pixel of the corresponding column, a switch electrically connecting the first capacitance and the signal line,
a capacitance adjustment unit electrically connected to the second capacitance, and
a connection unit configured to electrically connect the first capacitance of one of the signal processing units to the second capacitance of another one of the signal processing units mutually in parallel,
the capacitance adjustment unit includes a MOS transistor,
one of main electrodes of the MOS transistor is electrically connected to the second capacitance, and
another one of the main electrodes of the MOS transistor is electrically connected to a power supply node or the one of the main electrodes.

2. The photoelectric conversion apparatus according to claim 1,
wherein the switch is an MOS transistor, and the MOS transistor has a size equal to the MOS transistor included in the capacitance adjustment unit.

3. The photoelectric conversion apparatus according to claim 1,
wherein the capacitance adjustment unit is a capacitor element.

4. The photoelectric conversion apparatus according to claim 1,
wherein a capacitance value of the capacitance adjustment unit is equal to a capacitance value associated with the switch.

5. The photoelectric conversion apparatus according to claim 1,
wherein the first capacitance and the second capacitance have an equal capacitance value.

6. The photoelectric conversion apparatus according to claim 1,
wherein the signal processing unit further includes an amplifier configured to amplify a signal based on the pixel.

7. The photoelectric conversion apparatus according to claim 1,
wherein the signal processing unit further includes a noise reduction unit configured to reduce noise from the signal based on the pixel.

8. The photoelectric conversion apparatus according to claim 1,
wherein the signal processing unit further include
a third capacitance holding the signal based on the pixel, and
a buffer unit configured to transmit the signal held by the third capacitance to the first or second capacitance.

9. The photoelectric conversion apparatus according to claim 1,
wherein the photoelectric conversion apparatus operates in a first operation mode in which signals based on the pixels on different columns are added with each other by the connection unit and in a second operation mode in which the signals based on the pixels on the different columns are not added with each other by the connection unit.

10. An image pickup system comprising:
the photoelectric conversion apparatus according to claim 1;
an optical system configured to form an image on the plurality of pixels; and
an image signal processing unit configured to generate image data by processing signals output from the photoelectric conversion apparatus.

11. The photoelectric conversion apparatus according to claim 6,
wherein the amplifier has a variable amplification factor.

12. The photoelectric conversion apparatus according to claim 8,
wherein a capacitance value of the third capacitance is lower than a capacitance value of the first capacitance.

13. The photoelectric conversion apparatus according to claim 8,
wherein each of the plurality of columns includes the plurality of pixels, and
wherein an operation of transmitting a signal based on one of the pixels from the first capacitance to the signal line and an operation of holding a signal based on another one of the pixels in the third capacitance are at least partly carried out in parallel.

14. The photoelectric conversion apparatus according to claim 9,
wherein the signal processing unit further adds pixel signals based on the plurality of pixels on the corresponding column with each other in the first operation mode.

15. A photoelectric conversion apparatus comprising:
a plurality of pixels arranged in a matrix;
a plurality of signal processing units each corresponding to a column of the matrix; and
a signal line,
each of the plurality of signal processing units including
a first capacitance and a second capacitance holding a signal based on the pixel of the corresponding column,
a switch electrically connecting the first capacitance to the signal line,
a MOS transistor electrically connected to the second capacitance, and
a connection unit configured to electrically connect the first capacitance of one of the signal processing units to the second capacitance of another one of the signal processing units mutually in parallel,
wherein a source terminal and a drain terminal of the MOS transistor are short-circuited.

16. An image pickup system comprising:
the photoelectric conversion apparatus according to claim 15;
an optical system configured to form an image on the plurality of pixels; and
an image signal processing unit configured to generate image data by processing signals output from the photoelectric conversion apparatus.

17. A photoelectric conversion apparatus comprising:
a plurality of pixels arranged in a matrix;
a plurality of signal processing units each corresponding to a column of the matrix; and
a signal line,
each of the plurality of signal processing units including
a first capacitance and a second capacitance that hold a signal based on the pixel of the corresponding column,
a switch electrically connecting the first capacitance and the signal line,
a capacitance adjustment unit electrically connected to the second capacitance, and
a connection unit configured to electrically connect the first capacitance of one of the signal processing units to the second capacitance of another one of the signal processing units mutually in parallel,
wherein the photoelectric conversion apparatus operates in a first operation mode in which signals based on the pixels on different columns are added with each other by the connection unit and in a second operation mode in which the signals based on the pixels on the different columns are not added with each other by the connection unit.

18. The photoelectric conversion apparatus according to claim 17,
wherein the capacitance adjustment unit includes a MOS transistor in which one of main electrodes is electrically connected to the second capacitance, and the other of the main electrodes is electrically connected to a power supply or the one of the main electrodes.

19. The photoelectric conversion apparatus according to claim 17,
wherein the capacitance adjustment unit is a capacitor element.

20. The photoelectric conversion apparatus according to claim 17,
wherein a capacitance value of the capacitance adjustment unit is equal to a capacitance value associated with the switch.

21. The photoelectric conversion apparatus according to claim 17,
wherein the first capacitance and the second capacitance have an equal capacitance value.

22. The photoelectric conversion apparatus according to claim 17,
wherein the signal processing unit further includes an amplifier configured to amplify a signal based on the pixel.

23. The photoelectric conversion apparatus according to claim 17,
wherein the amplifier has a variable amplification factor.

24. The photoelectric conversion apparatus according to claim 17,
wherein the signal processing unit further includes a noise reduction unit configured to reduce noise from the signal based on the pixel.

25. The photoelectric conversion apparatus according to claim 17,
wherein the signal processing unit further include
a third capacitance holding the signal based on the pixel, and
a buffer unit configured to transmit the signal held by the third capacitance to the first or second capacitance.

26. The photoelectric conversion apparatus according to claim 17, wherein the signal processing unit further adds pixel signals based on the plurality of pixels on the corresponding column with each other in the first operation mode.

27. An image pickup system comprising:
the photoelectric conversion apparatus according to claim 17;
an optical system configured to form an image on the plurality of pixels; and
an image signal processing unit configured to generate image data by processing signals output from the photoelectric conversion apparatus.

28. The photoelectric conversion apparatus according to claim 18,
wherein the switch is an MOS transistor, and the MOS transistor has a size equal to the MOS transistor included in the capacitance adjustment unit.

29. The photoelectric conversion apparatus according to claim 25,
wherein a capacitance value of the third capacitance is lower than a capacitance value of the first capacitance.

30. The photoelectric conversion apparatus according to claim 25,
wherein each of the plurality of columns includes the plurality of pixels, and
wherein an operation of transmitting a signal based on one of the pixels from the first capacitance to the signal line and an operation of holding a signal based on another one of the pixels in the third capacitance are at least partly carried out in parallel.

* * * * *